United States Patent
Kawahara et al.

(10) Patent No.: US 6,618,086 B1
(45) Date of Patent: *Sep. 9, 2003

(54) LINEAR IMAGE SENSOR

(75) Inventors: Yukito Kawahara, Chiba (JP); Tooru Shimizu, Chiba (JP); Satoshi Machida, Chiba (JP); Masahiro Yokomichi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/065,994

(22) Filed: Apr. 24, 1998

(30) Foreign Application Priority Data

| Apr. 25, 1997 | (JP) | .............................. 9-109706 |
| Apr. 25, 1997 | (JP) | .............................. 9-109707 |
| Apr. 25, 1997 | (JP) | .............................. 9-109708 |
| Mar. 23, 1998 | (JP) | ............................. 10-074662 |

(51) Int. Cl.$^7$ .......................... H04N 3/14; H01L 31/062
(52) U.S. Cl. ....................................... 348/302; 257/291
(58) Field of Search .............................. 348/302, 307, 348/308, 309, 310, 294, 304; 250/208.1; 257/291

(56) References Cited

U.S. PATENT DOCUMENTS

| 5,406,332 A | * | 4/1995 | Shinohara et al. | .......... 348/308 |
| 5,717,458 A | * | 2/1998 | Yonemoto | .................... 348/304 |
| 5,831,675 A | * | 11/1998 | Ueno | ......................... 348/302 |
| 6,303,919 B1 | * | 10/2001 | Yokomichi et al. | ...... 250/208.1 |

* cited by examiner

Primary Examiner—Wendy R. Garber
Assistant Examiner—Rashawn N. Tillery
(74) Attorney, Agent, or Firm—Adams & Wilks

(57) ABSTRACT

A linear image sensor using phototransistors as light receiving elements has improved after-image characteristics and reduced production costs by providing a light-receiving MOS diode proximate each photosensor, placing the MOS diode in an inversion state during the accumulation of photo-charge so that the accumulated photo-charge is accumulated at a base region of the phototransistors, placing the MOS diode in an accumulating state during a reset operation to return the phototransistors to an initial state after a readout operation has been performed, so that residual charge without reading out is transferred to the base region of the phototransistors and an after-image caused by residual charge is reduced through an emitter of the phototransistors.

23 Claims, 5 Drawing Sheets

FIG. 2A
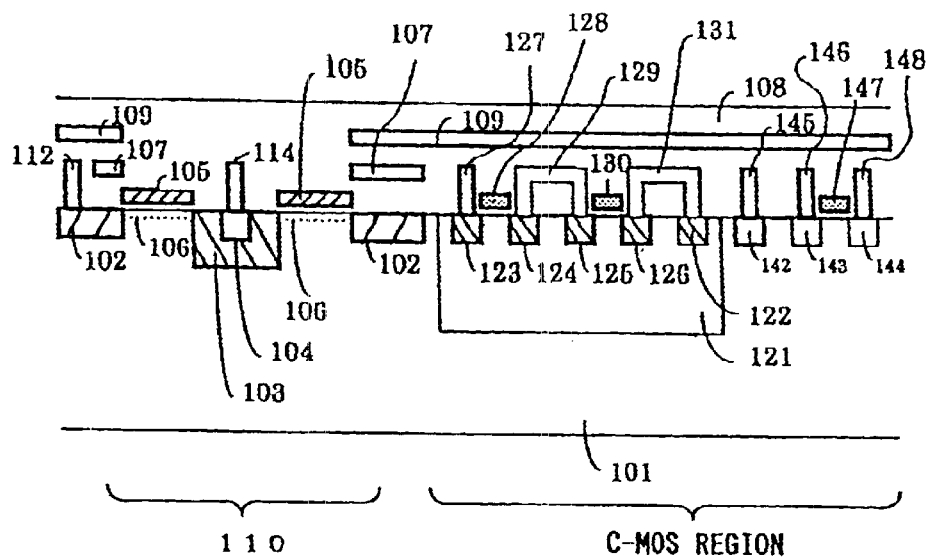
FIG. 2B
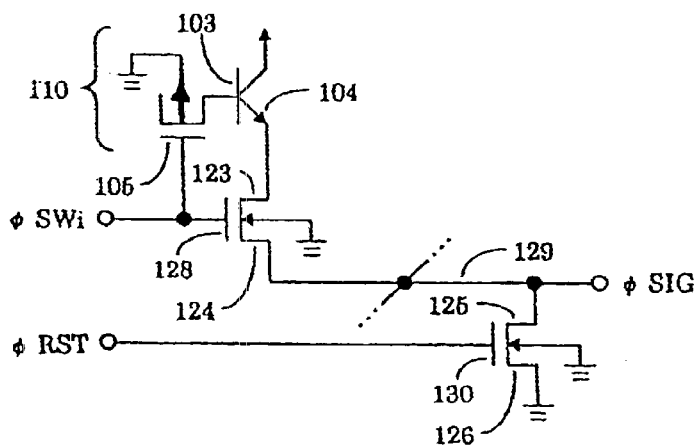
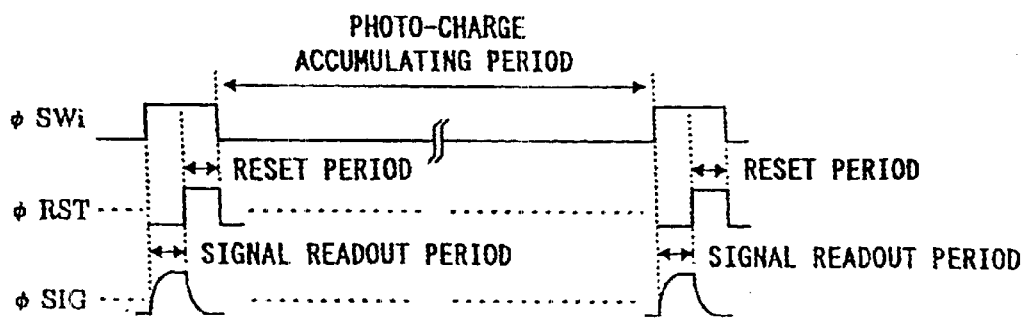
FIG. 2C

LINEAR IMAGE SENSOR

BACKGROUND OF THE INVENTION

The present invention relates to an image sensor which reads picture-information and electrically transmits it, and which is suitable for a facsimile or image scanner apparatus.

In a prior art linear image sensor, the light-receiving element of the linear image sensor is typically as disclosed in Japanese Patent Disclosure S61-124171. The structure is shown in FIG. 5. In FIG. 5, symbol 4 is a separated (or separation) layer, symbol 3 is an epitaxial layer and collector, symbol 6 is a base, and symbol 9 is an emitter.

However, since the junction capacitance is large and the base region is in a floating state because the junction portion between the base and collector is wide, there has been a problem of an after-image in which the last signal of a bright state remains in the readout signal even when the read out image changes from a bright state to a dark state so that a distinct picture is not obtained.

SUMMARY OF THE INVENTION

To solve the above problem, the sensor of the present invention comprises a light-receiving MOS diode in which a part of a light-receiving element is covered with a light-transmissive electrode for transmitting a part of light, and letting the light-receiving MOS diode operate in an inversion state while accumulating photo-charge, so that the generated photo-charge is accumulated in the inversion region thereof and base region of phototransistor. By placing the light-receiving MOS diode in an accumulating state during a reset time after readout to the outside and resetting through the emitter in a state in which photo-charge density of the base region is raised to move residual charge without performing readout to the base region, residual charge causing an after-image is reduced. By placing the light-receiving MOS diode in the accumulating state even during readout lets photo-charge accumulated under the light-receiving MOS diode move to the base region, and enlarging the voltage between the base and emitter makes bipolar transistor operation of the phototransistor easy. This characteristic is improved even when the read picture changes from a dark state to a bright state or, conversely from the above-mentioned operation, from a bright state to a dark state, in which rising of a readout signal is a little lower than rising of a signal of enough bright state.

By forming the inversion region of the light-receiving diode and the base of the phototransistor with the same conductivity type, elements constructing a unit light-receiving element are reduced. In order to transfer photo-charge accumulated at the inversion region under the light-receiving MOS diode to the base of the phototransistor uniformly and surely between a plurality of light-receiving elements, the gate electrode of the light-receiving MOS diode covers at least a part of the base of the phototransistor through isolating coating. By forming a MOS transistor for switching to read a signal out from the light-receiving elements outside on a substrate of conductive (or conductivity) type which is different from the conductive type of the substrate that the light-receiving MOS diode is formed with and by making the gate electrodes common, element area is reduced.

By forming the base of the phototransistor with a well of a C-MOS transistor of a peripheral circuit, a base process added to C-MOS manufacturing process is reduced so as to realize a low cost linear image sensor.

By not applying constantly electric field of more than 0.7 MV/cm to the gate oxide film of the light-receiving MOS diode, influence of surface recombination current having impact is stable. Further by reducing threshold voltage of the light-receiving MOS diode, the diode operates keeping inversion state even at readout, and surface recombination current of oxide film boundary which is active by depletion becomes small.

BRIEF DESCRIPTION THE DRAWINGS

FIG. 2A is a sectional structural view showing a light-receiving element and a switching element of a linear image sensor of the present invention.

FIG. 2B is a circuit diagram of a light-receiving element and a switching element in a linear image sensor of the present invention.

FIG. 2C is a timing chart of a light-receiving element and a switching element in a linear image sensor of the present invention.

DETAILED DESCRIPTION OF THE INVENTION

Figure 1A:
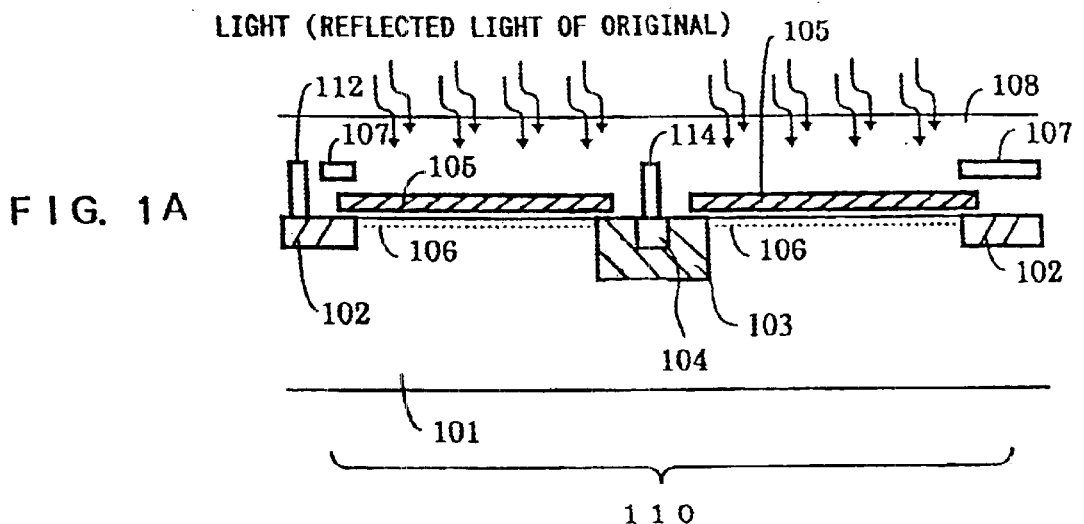
FIG. 1A is a sectional structural view showing a light-receiving element of a linear image sensor of the present invention at photo-charge accumulation.

Referring to the attached figures, embodiments of the present invention will be described bellow. FIG. 1A is a sectional structural view showing an embodiment of a light-receiving element in a linear image sensor of the present invention.

Figure 1B:
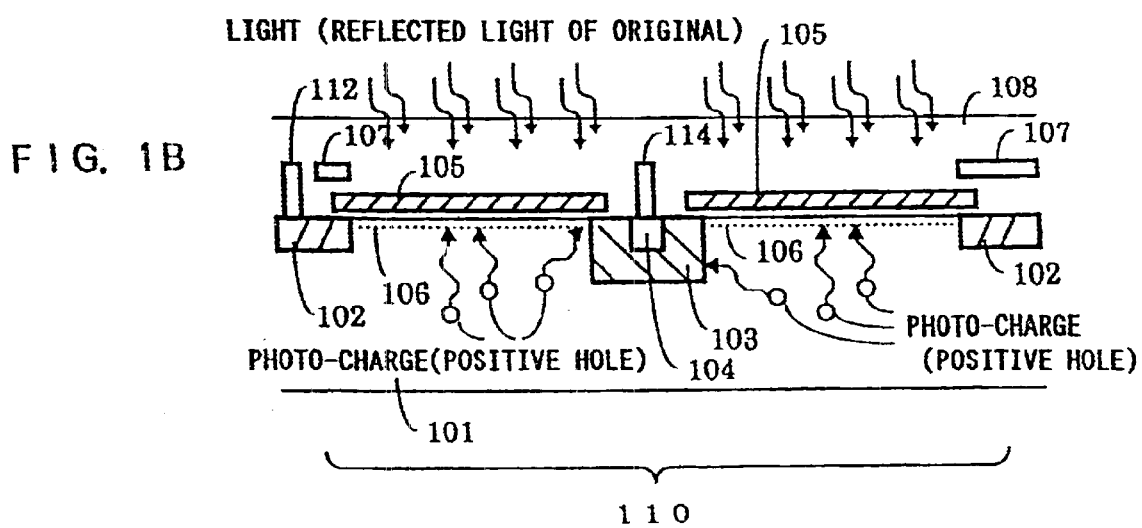
FIG. 1B is a sectional structural view showing a light-receiving element of a linear image sensor of the present invention at photo-charge accumulation.

Symbol 101 is an n-type silicon semiconductor substrate, symbol 102 is an n-type region formed to supply voltage to the semiconductor substrate and being high in impurity density, symbol 112 is a metal electrode thereof, symbol 103 is a p-type base region of a bipolar transistor, symbol 113 is a metal electrode thereof, symbol 104 is an n-type emitter region of the bipolar transistor, symbol 114 is a metal electrode thereof, and symbol 105 is a gate electrode of a light-receiving MOS diode made of polycrystalline silicon transmitting at least a part of light. Symbol 106 shows an inversion region when negative voltage is applied to the gate electrode 105 of the light-receiving MOS diode and the surface of the n-type silicon semiconductor substrate 101 turns in inversion state and the n-type silicon semiconductor substrate 101 forms a substrate region of the light-receiving MOS diode and a collector region of the phototransistor. Symbol 107 is a shielding layer, symbol 108 is a hyaline protection layer for transmitting light, and symbol 110 is a light-receiving element region formed with the phototransistor and the light-receiving MOS diode. Next, referring to FIG. 1B, a state in which light is applied will be described.

Figure 1C:
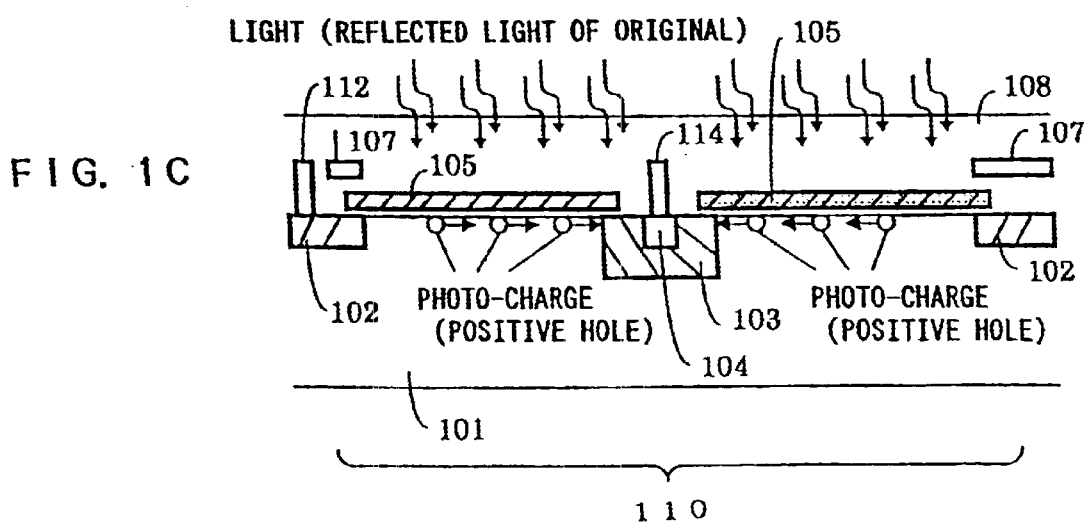
FIG. 1C is a sectional structural view showing a light-receiving element of a linear image sensor of the present invention at readout and reset time.

When a light is applied to the light-receiving element region 110 during accumulation in which an original picture is being read out, positive holes of photo-charge generated in the n-type silicon semiconductor substrate 101 is accumulated in the base 103 or the inversion region 106. Although a part of the positive holes of the generated photo-charge reaches the base 103 in the light-receiving element region 110 so as to accumulate at the base, the rest does not reach the base 103 and distinguishes, and diffuses or drifts to near other light-receiving element region or negative voltage region. As a result, photo-charge generated at the light-receiving element region is not accumulated and can not be read out to the outside. By forming the inversion region 106 under the light-receiving MOS diode and accumulating the charge, similar photoelectric transfer efficiency with a light-receiving element comprising a phototransistor having a wide base region is obtained. Next, in FIG. 1C, a readout operation of the picture signal and a reset operation for returning the light-receiving element to an initial condition are shown. After the accumulation operation, a readout switch is placed in an ON state and a picture signal is read out to the outside. At readout time, by applying positive voltage to the gate electrode 105, placing the surface of the n-type silicon semiconductor substrate 101 under the light-receiving MOS diode in an accumulating state from an inversion state, driving the positive holes of the photo-charge accumulated by the previous state in the inversion region 106 to the base region 103, and enlarging the voltage between the base and emitter, bipolar transistor operation of the phototransistor becomes easy. As a result, the characteristic is improved in which rising of a readout signal from a dark state to a bright state is a little smaller than rising of a signal of enough bright state when the read picture changes from dark state to bright state. After readout to the outside, at a reset time for returning the light-receiving element to the initial state, positive voltage is applied to the gate electrode 105 continuously, and the surface of the n-type semiconductor substrate under the light-receiving MOS diode is kept in the accumulating state. In that manner, residual charge without-readout to the outside is reset to a reset voltage through the emitter 104 while keeping a current moving in the base region 103 and increasing the photo-charge density of the base region, and residual charge causing after-image is reduced.

By forming the inversion region 106 of the light-receiving diode and base 103 of the phototransistor with the same conductive type, elements constructing a unit light-receiving element are reduced. In order to transfer photo-charge accumulated at the inversion region 106 under the light-receiving MOS diode to the base 103 of the phototransistor surely, the gate electrode 105 of the light-receiving MOS diode covers at least a part of the base of the phototransistor through isolation layer.

FIG. 2A is a sectional structural view of another embodiment of the present invention, which includes switching elements or reset elements comprising MOS transistors. Adding to the light-receiving element region 110 shown FIG. 1A, symbol 109 is a metal thin film for shielding, symbol 121 is a p-well conductive type of which is different from the n-type silicon semiconductor substrate 101, symbols 123 and 124 are a drain region and source region of an n-channel MOS transistor for switching formed in the p-well 121, symbol 128 is a gate electrode of the MOS transistor, and symbol 127 as a leading electrode from the drain region connected to the metal electrode of said emitter 104 so as to be same voltage. Symbols 125 and 126 are a drain region and a source region of the n-channel MOS transistor for reset formed in the p-well 121, symbol 130 is a gate electrode of the MOS transistor, symbol 131 is a leading electrode from the source region 126 connected to a diffusion region 122 applying Gnd voltage being reset voltage. The conductive type of the diffusion region 123 is the same as the p-well 121, and voltage is applied the p-well too. The source region 124 of said MOS transistor for switching and the drain region 125 of the MOS transistor for reset are connected with a metal wiring 129. The metal wiring 129 is connected to a circuit for reading the signal obtained at the light-receiving element out too. Referring to a circuit diagram of FIG. 2B and a timing chart of FIG. 2C, operation of the construction well be described. Readout switching pulse φSWi for reading the signal generated at the light-receiving portion out to outside is applied to the gate electrode 105 of the light-receiving MOS diode 105 and the gate electrode 128 of n-channel MOS transistor for switching, and picture signal is read out to outside as the signal φSWi for signal readout period. After that, reset pulse φRST is applied to the gate 130 of the n-channel MOS transistor for reset to initialize the light-receiving-element for reset period of the later half in high state of switching pulse φSWi. The photo-charge accumulating period is a period that the switching pulse φSWi is applied again and output to signal φSIG as a picture signal. In this manner, the gate electrode 105 of the light-receiving MOS diode and the gate electrode 128 of the n-channel MOS transistor for switching are connected at readout and reset time. At photo-charge accumulating, negative voltage is applied to the gate electrode 105 of the light-receiving MOS diode and the gate electrode 128 of the n-channel MOS transistor for switching at the same time so as to form the inversion region 106, the switching MOS transistor is turned in non-conductive state, and photo-charge can be accumulated at the base 103 and the inversion region 106. At readout and reset time, positive voltage is applied to the gate electrode 105 of the light-receiving MOS diode and the gate electrode 128 of the n-channel MOS transistor, for switching at the same time, the n-channel MOS transistor for switching is turned in conductive state. By changing the inversion region 106 under the light-receiving MOS diode to accumulating region, moving the photo-charge accumulated in the inversion region 106, and enlarging voltage between the base and emitter, readout and reset becomes easy. As the gate electrode 105 of the light-receiving MOS diode covers at least a part of the base region of the phototransistor through an isolation layer, photo-charge accumulated in the inversion region 106 can be moved surely to the base region 103 so that uniform photoelectric efficiency is obtained between a plural of light-receiving elements. Thus, the gate electrode 105 of the light-receiving MOS diode and the gate electrode 128 of the n-channel MOS transistor for switching are controlled at the same scanning circuit, and numbers of elements constructing the circuit of the linear image sensor can be reduced. In other words, by forming the MOS transistor for switching reading the signal from the light-receiving element out to outside on the substrate of conductive type which is different from conductive type of substrate in which the light-receiving MOS diode is formed, and by making the gate electrodes common, size of the circuit becomes small and uniform photoelectric efficiency is obtained between a plural of light-receiving elements. Reset operation is carried out by the following steps: to keep the MOS transistor for switching in conductive state after end of readout; to make the MOS transistor for reset conductive state from non-conductive state of readout time; and to apply reset voltage to the emitter 102 of the phototransistor through the MOS transistor for reset and MOS transistor for switching. Although the image sensor is described using the n-channel silicon semiconductor substrate 101 for convenience sake, a p-channel silicon semiconductor substrate too is useful. Although polycrystalline silicon is used for the gate electrode 105 of the light-receiving MOS diode, transparent conductive thin film as ITO or the like too is useful.

Figure 3:
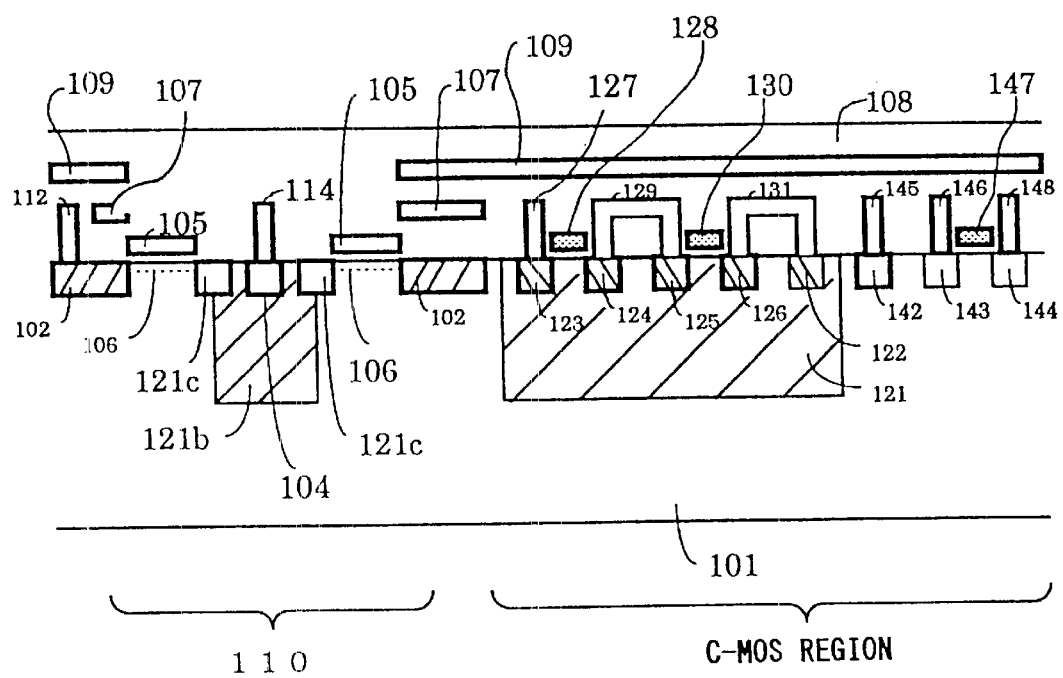
FIG. 3 is a sectional structural view showing a light-receiving element and a switching element of an another embodiment in a linear image sensor of the present invention, which are formed with p well base.

FIG. 3 is a sectional structural view of another embodiment of the present invention, which includes a switching element and a reset element comprising MOS transistor. a p-well base 121b formed, at the same time when the p-well 121 used for C-MOS transistor is formed replaces the base of FIG. 1A and FIG. 2A, and a light-receiving element is used, in which a diffusion region 121c has the same conductive type as the well diffusion region on at least a part of surface of the p-well base and high impurity density. Thus, by forming the base of the phototransistor with a well of a C-MOS transistor of a peripheral circuit at the same time, a base process added to C-MOS manufacturing process is reduced so as to realize a low cost linear image sensor. Although a diffusion region 121c may be excluded by replacing the diffusion region 121c with the p-well base 121b, the existence of the diffusion region 121c shown in FIG. 3 makes better performance in the temperature characteristic and the like.

The way of operation accords with FIG. 2B and FIG. 2C.

Although two states are described here, which generate by voltage of the gate electrode 105 of the light-receiving diode, and which are the inversion state and the accumulating sate of silicon surface under the gate electrode 105 of the light-receiving diode, more stable operation for operation voltage and operation temperature is realized by varying electric field intensity and threshold of the MOS diode forming the light-receiving diode.

Surface recombination generating at the inversion region of the light-receiving diode and surface of isolation formed thereon has an impact to accumulated photo-charge value and causes unstable photoelectric characteristic. Thickness of the isolation layer between the n-type silicon semiconductor substrate 101 and the gate electrode 105 is more than 800 angstrom, and voltage between the gate electrode 105 and the n-type silicon semiconductor substrate 101 is 5.5 V maximum. By that, the maximum electric field intensity is less than 0.7 MV/cm, and charge value flowing in the layer is held down so as to hold increase of surface recombination down. By introducing n-type impurity moderately to surface of the n-type silicon semiconductor substrate, the inversion region 106 is formed under the light-receiving MOS diode even at readout and reset time. the inversion region 106 always exists at surface of the n-type silicon semiconductor substrate so as to hold activation of surface recombination occurring in depletion. By holding the surface recombination down and making stable, a stable photoelectric characteristic is obtained as the result.

Figure 4:
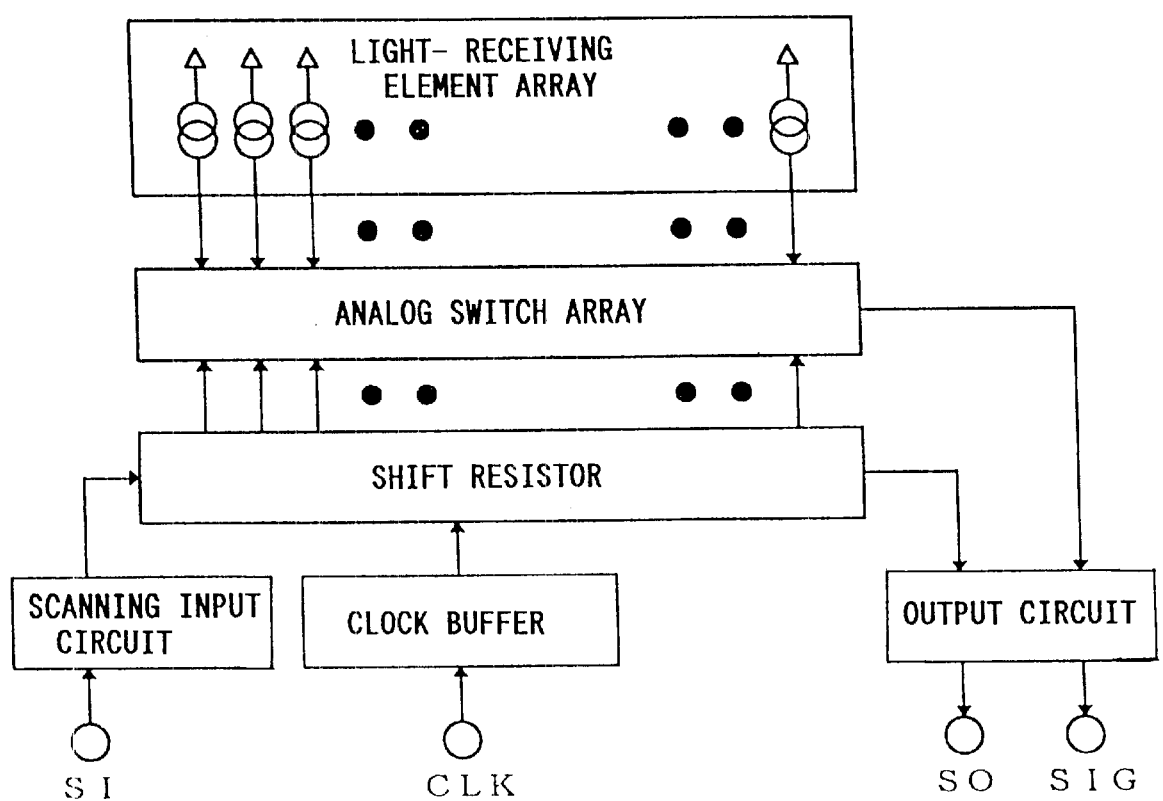
FIG. 4 is a block diagram of a linear image sensor of the present invention.
Figure 5:
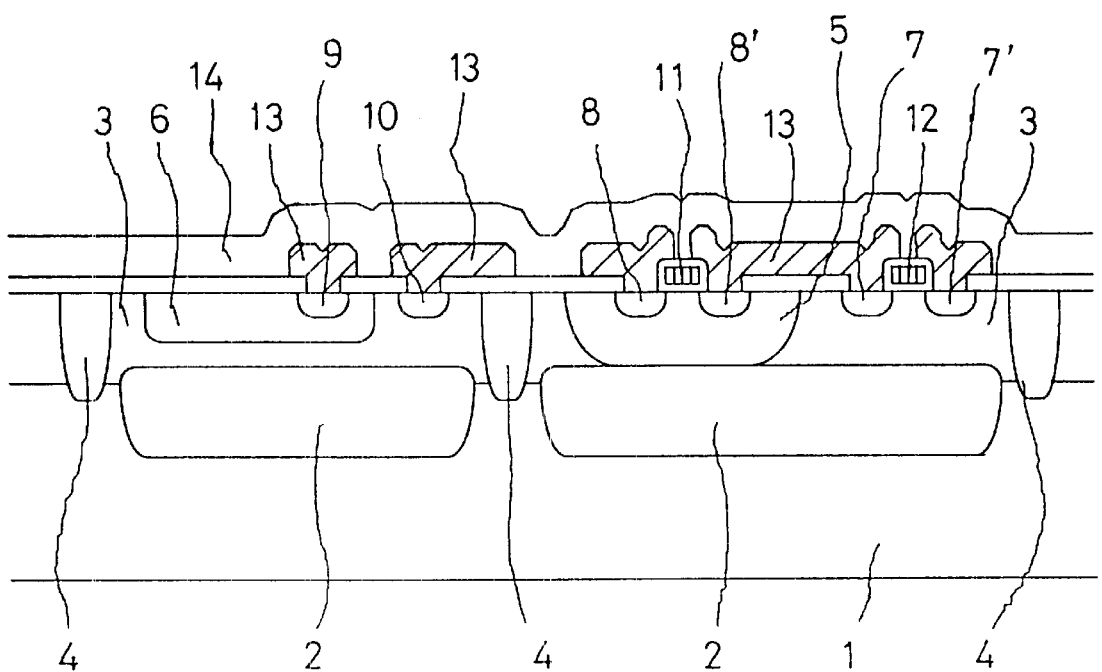
FIG. 5 is a sectional structural view showing a light-receiving element of the prior linear image sensor.

FIG. 4 is a block diagram showing an embodiment of the present invention. The circuit comprises a light-receiving element array having a plural of phototransistors, an analog switch array having a plural of switching elements, a shift resistor being a scanning circuit, a scanning input circuit driving the shift resistor, a clock buffer, and an output circuit outputting the output signal of the scanning circuit and a picture signal obtained at the light-receiving element.

As above-mentioned, by using the present invention, the following are realized:

charge accumulating at the base region of the phototransistor after readout is reduced so as to improve after-image characteristic;

after-image characteristic is improved and photoelectric efficiency is kept;

capacity between base and collector and readout of signal charge becomes easy so as to improve rising characteristic at rime turning to bright state from dark state;

uniformity of photoelectric efficiency between a plural of the light receiving elements is improved;

the number of the elements of the scanning circuit is reduced so as to realize a low cost linear image sensor; and the base process formed adding to the C-MOS manufacturing process is cut so as to realize a low cost linear image sensor.

What is claimed is:

1. A linear image sensor comprising: a plurality of bipolar phototransistors arranged on a semiconductor substrate for reading picture information and outputting corresponding signals; a plurality of switching elements for reading the signals output by the phototransistors, an input terminal of each switching element being connected to a respective phototransistor; a scanning circuit for driving control terminals of the plurality of switching elements; and a light-receiving MOS diode formed near each phototransistor and being covered with a light-transmissive gate electrode for passing at least a part of light incident thereon, each light-receiving MOS diode being placed in an inversion state during a photo-charge accumulating operation for reading a picture, and being placed in a weak inversion state or an accumulating state during a reset operation for resetting a phototransistor to an initial state and during a readout operation for reading out the picture information.

2. A linear image sensor comprising: a plurality of bipolar phototransistors arranged on a semiconductor substrate for reading picture information and outputting corresponding signals; a plurality of switching elements for reading signals output by the phototransistors, an input terminal of each switching element being connected to a respective phototransistor; a scanning circuit for driving control terminals of the switching elements; and a light-receiving MOS diode formed near each phototransistor and being covered with a light-transmissive gate electrode for passing at least a part of light incident thereon, a conductivity type of an inversion region of the light-receiving MOS diode being the same as that of a base region of the phototransistors, and the gate electrode of each light-receiving MOS diode covering at least a, part of a base region of an adjacent phototransistor through an isolation layer.

3. A linear image sensor according to claim 2; wherein each of the switching elements comprises a MOS transistor formed on a substrate having a different conductivity type from that of a substrate in which the light-receiving MOS diode is formed, and the gate of the light-receiving MOS diode and a gate of the MOS transistor are held at the same voltage.

4. A linear image sensor according to claim 3; wherein each of the light-receiving MOS diodes is placed in an inversion state during a photo-charge accumulating operation for reading a picture, and is placed in a weak inversion state or an accumulating state during a reset operation for resetting a phototransistor to an initial state.

5. A linear image sensor according to claim 4; wherein the light-receiving MOS diodes are placed in a weak inversion state or an accumulating state during a readout operation for reading out the picture information.

6. A linear image sensor comprising: a plurality of bipolar phototransistors arranged on a semiconductor substrate for reading picture information and outputting corresponding signals; a plurality of switching elements for reading the signals output by the phototransistors, an input terminal of each switching element being connected to a respective phototransistor; a scanning circuit for driving control terminals of the switching elements; and a light-receiving MOS diode formed near each phototransistor and being covered with a light-transmissive gate electrode for passing at least a part of light incident thereon and having an inversion region with the same conductivity type as that of a base region of the phototransistors; wherein the switching elements and the scanning circuit comprise MOS transistors, base regions of the phototransistors have a different conductivity type from that of the semiconductor substrate and are formed in well diffusion regions also forming well diffusion regions of the MOS transistors of the switching element and the scanning circuit, and diffusion regions are formed in a surface of the semiconductor substrate in the well diffusion regions, the diffusion regions having the same conductivity type as that of the well diffusion regions and having a higher impurity density.

7. A linear image sensor according to claim 6; wherein the gate electrode of the light-receiving MOS diode covers at least a part of a base region of an adjacent phototransistor through an isolation layer.

8. A linear image sensor according to claim 7; wherein the switching elements comprise MOS transistors formed on a substrate having a different conductivity type from the substrate in which the light-receiving MOS diodes are formed, and the gates of the light-receiving MOS diodes and the gates of the MOS transistors are held at the same voltage.

9. A linear image sensor according to claim 8; wherein each of the light-receiving MOS diodes is placed in an inversion state during a photo-charge accumulating operation for reading a picture, and is placed in an accumulating state during a reset operation for resetting a phototransistor to an initial state.

10. A linear image sensor according to claim 9; wherein the light-receiving MOS diodes are placed in a weak inversion state or an accumulating state during a readout operation for reading out the picture information.

11. A linear image sensor according to claim 7; wherein the base regions of the respective phototransistors are formed in the well diffusion regions, and a diffusion region is formed in each well diffusion region, the diffusion region having the same conductivity type as that of the well diffusion region and having a higher impurity density.

12. A linear image sensor according to claim 1; wherein each of the light-receiving MOS diodes has a gate oxide layer under the gate electrode, and an electrical field applied to the gate oxide layer is no more than 0.7 MV/cm.

13. A linear image sensor according to claim 1; wherein the light-receiving MOS diodes are always held in an inversion state to reduce a threshold voltage thereof.

14. A linear image sensor according to claim 3; wherein the light-receiving MOS diodes are always held in an inversion state to reduce a threshold voltage thereof.

15. A linear image sensor according to claim 6; wherein the light-receiving MOS diodes are always held in an inversion state to reduce a threshold voltage thereof.

16. A unit light receiving element for a linear image sensor, comprising: a photosensor for producing an image signal corresponding to an image to be read; and a light-receiving diode proximate the photosensor and having a light-transmissive gate electrode formed thereon for passing at least a portion of light incident thereon, the gate electrode covering at least a part of a base region of an adjacent photosensor through an isolation layer, the light-receiving diode being placed in an inversion state during a photo-charge accumulating operation in which an image signal is read from the photosensor, and placed in an inversion state or an accumulating state during a reset operation for resetting the photosensor to an initial state and during a readout operation for reading out the picture information.

17. A unit light receiving element according to claim 16; wherein the light-receiving diode is placed in the inversion state by applying a voltage to the gate electrode.

18. A unit light receiving element according to claim 17; wherein the light-receiving diode is placed in the accumulating state by applying a voltage to the gate electrode with a polarity opposite to the voltage applied to place the light-receiving diode in an inversion state.

19. A unit light receiving element according to claim 16; further comprising a switching element for reading the image signal output by the photosensor.

20. A unit light receiving element according to claim 19; wherein the switching element comprises a MOS transistor formed in a substrate having an opposite conductivity type from that of a substrate in which the light-receiving diode is formed.

21. A unit light receiving element according to claim 16; wherein a conductivity type of an inversion region of the light-receiving diode is the same as that of a base region of the photosensor.

22. A unit light receiving element according to claim 16; wherein the photosensor comprises a phototransistor and the light-receiving diode is a MOS diode.

23. An image sensor having a plurality of unit light receiving elements according to claim 16, a plurality of switching elements for reading the image signals output by the photosensors, an input terminal of each switching element being connected to a photosensor of a respective unit light receiving element, and a scanning circuit for driving control terminals of the plurality of switching elements.

\* \* \* \* \*